(12) United States Patent
Park

(10) Patent No.: US 12,525,937 B2
(45) Date of Patent: Jan. 13, 2026

(54) SELF-CONTROLLED INPUT DATA BUFFER CIRCUIT CAPABLE OF AUTOMATICALLY ADJUSTING POWER GAIN

(71) Applicant: Fujian Jinhua Integrated Circuit Co., Ltd., Quanzhou (CN)

(72) Inventor: Minho Park, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 419 days.

(21) Appl. No.: 18/201,198

(22) Filed: May 24, 2023

(65) Prior Publication Data
US 2024/0235502 A1    Jul. 11, 2024

(30) Foreign Application Priority Data

Jan. 9, 2023  (CN) .......................... 202310027034.9
Jan. 9, 2023  (CN) .......................... 202320053367.4

(51) Int. Cl.
*H03F 3/45*     (2006.01)
*H03F 1/26*     (2006.01)

(52) U.S. Cl.
CPC .......... *H03F 3/45197* (2013.01); *H03F 1/26* (2013.01); *H03F 3/45273* (2013.01)

(58) Field of Classification Search
CPC ......................................................... H03F 3/45
USPC .................................................. 330/260, 254
See application file for complete search history.

(56) References Cited

U.S. PATENT DOCUMENTS

| | | | | |
|---|---|---|---|---|
| 3,919,654 A | * | 11/1975 | Toumani | .................. H03G 7/06 330/136 |
| 6,121,831 A | * | 9/2000 | Mack | .................. H03F 3/45479 327/307 |
| 7,622,986 B2 | | 11/2009 | Pan | |
| 7,733,260 B2 | * | 6/2010 | Lee | ......................... H03K 5/133 330/150 |
| 9,331,646 B2 | | 5/2016 | Taylor | |
| 2006/0066399 A1 | * | 3/2006 | Stoger | ................. H03F 3/45183 330/254 |

* cited by examiner

*Primary Examiner* — Henry Choe
(74) *Attorney, Agent, or Firm* — Winston Hsu

(57) ABSTRACT

A self-controlled input data buffer circuit includes a first amplifier, a second amplifier, a feedback signal generator, and a gain control unit. The first amplifier includes a first input terminal for receiving a data signal, a second input terminal for receiving a reference signal, a first output terminal, and a second output terminal. The second amplifier is coupled to the first output terminal of the first amplifier and the second output terminal of the first amplifier. The feedback signal generator is coupled to the second amplifier. The gain control unit is coupled to the feedback signal generator, the second input terminal of the first amplifier, the first output terminal of the first amplifier, and the second output terminal of the first amplifier.

10 Claims, 3 Drawing Sheets

SELF-CONTROLLED INPUT DATA BUFFER CIRCUIT CAPABLE OF AUTOMATICALLY ADJUSTING POWER GAIN

BACKGROUND OF THE INVENTION

1. Field of the Invention

The present invention illustrates a self-controlled input data buffer circuit, and more particularly, a self-controlled input data buffer circuit capable of automatically adjusting power gain.

2. Description of the Prior Art

With the rapid development of technology, various volatile and non-volatile memory components are used in computer systems. Dynamic random access memory (DRAM) is a semiconductor memory categorized as a volatile memory. DRAM can use a plurality of charges stored in a capacitor for indicating if a binary bit logic is 1 or 0. DRAM can be regarded as a short-term data storage unit of the computer system. Since DRAM can be used for saving data currently used, the data currently used can be quickly accessed by the computer system.

DRAM can provide high-speed data transmission capability and high bandwidth utilization. However, since the high-speed data transmission capability and high bandwidth utilization of DRAM are required, power consumption is greatly increased. Therefore, to develop a self-controlled input data buffer circuit capable of automatically adjusting power gain for optimizing power consumption is an important issue.

SUMMARY OF THE INVENTION

In an embodiment of the present invention, a self-controlled input data buffer circuit is disclosed. The self-controlled input data buffer circuit comprises a first amplifier, a second amplifier, a feedback signal generator, and a gain control unit. The first amplifier comprises a first input terminal configured to receive a data signal, a second input terminal configured to receive a reference signal, a first output terminal, and a second output terminal. The second amplifier is coupled to the first output terminal of the first amplifier and the second output terminal of the first amplifier. The feedback signal generator is coupled to the second amplifier. The gain control unit is coupled to the feedback signal generator, the second input terminal of the first amplifier, the first output terminal of the first amplifier, and the second output terminal of the first amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
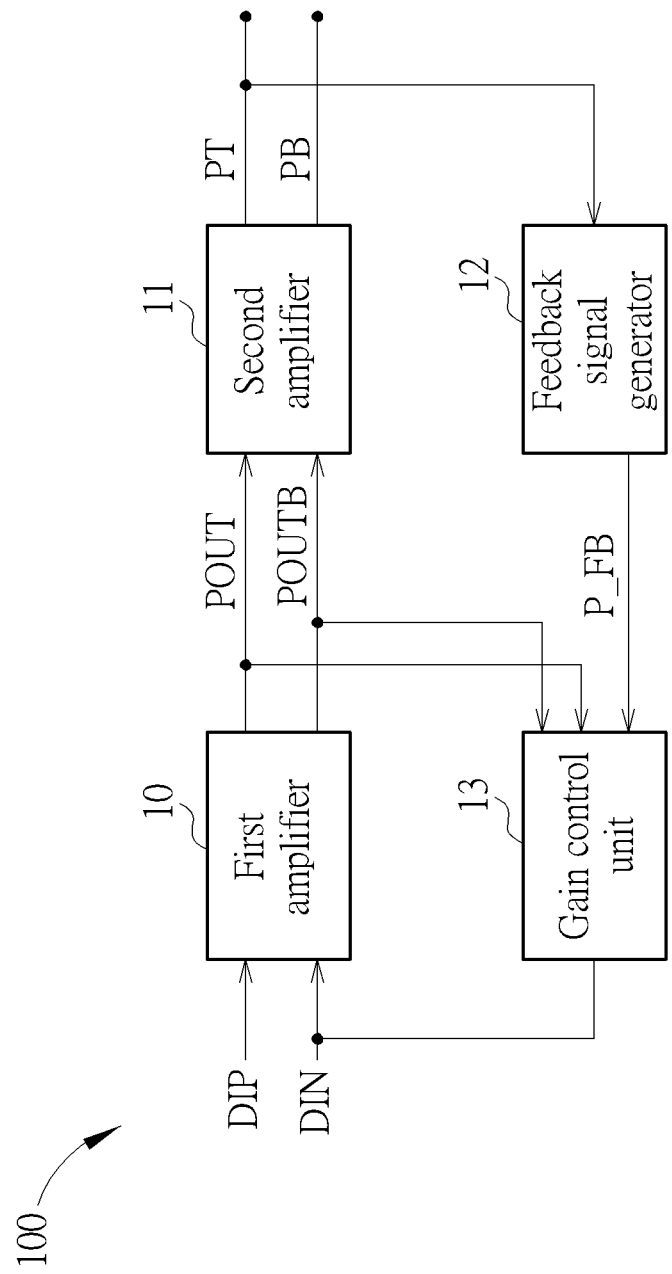
FIG. 1 is a block diagram of a self-controlled input data buffer circuit according to an embodiment of the present invention.

FIG. 1 is a block diagram of a self-controlled input data buffer circuit 100 according to an embodiment of the present invention. The self-controlled input data buffer circuit 100 can be used for performing an automatic gain control mechanism according to input data. Therefore, since the power gain can be adjusted, the self-controlled input data buffer circuit 100 can optimize power consumption. Details of the self-controlled input data buffer circuit 100 are illustrated below. The self-controlled input data buffer circuit 100 includes a first amplifier 10, a second amplifier 11, a feedback signal generator 12, and a gain control unit 13. The first amplifier 10 includes a first input terminal, a second input terminal, a first output terminal, and a second output terminal. The first input terminal is used for receiving a data signal DIP. The second input terminal is used for receiving a reference signal DIN. The second amplifier 11 is coupled to the first output terminal of the first amplifier 10 and the second output terminal of the first amplifier 10. The feedback signal generator 12 is coupled to the second amplifier 11. The gain control unit 13 is coupled to the feedback signal generator 12, the first output terminal of the first amplifier 10, the second output terminal of the first amplifier 10, and the second input terminal of the first amplifier 10. In the self-controlled input data buffer circuit 100, the first amplifier 10, the second amplifier 11, the feedback signal generator 12, and the gain control unit 13 can form a circuit loop capable of automatically controlling power gain. For example, after the data signal DIP is amplified by the first amplifier 10 and the second amplifier 11, it can be outputted to the feedback signal generator 12 for generating a feedback signal P_FB. After the feedback signal P_FB is received by the gain control unit 13, the gain control unit 13 can adjust the power gain according to two outputs (i.e., POUT and POUTB) of the first amplifier 11. Further, the two outputs (i.e., POUT and POUTB) of the first amplifier 11 are related to the data signal DIP. In other words, since the gain control unit 13 can adjust the power gain according to the data signal DIP, the power consumption of the self-controlled input data buffer circuit 100 can be optimized. Circuit Details of the self-controlled input data buffer circuit 100 are illustrated later.

Figure 2:
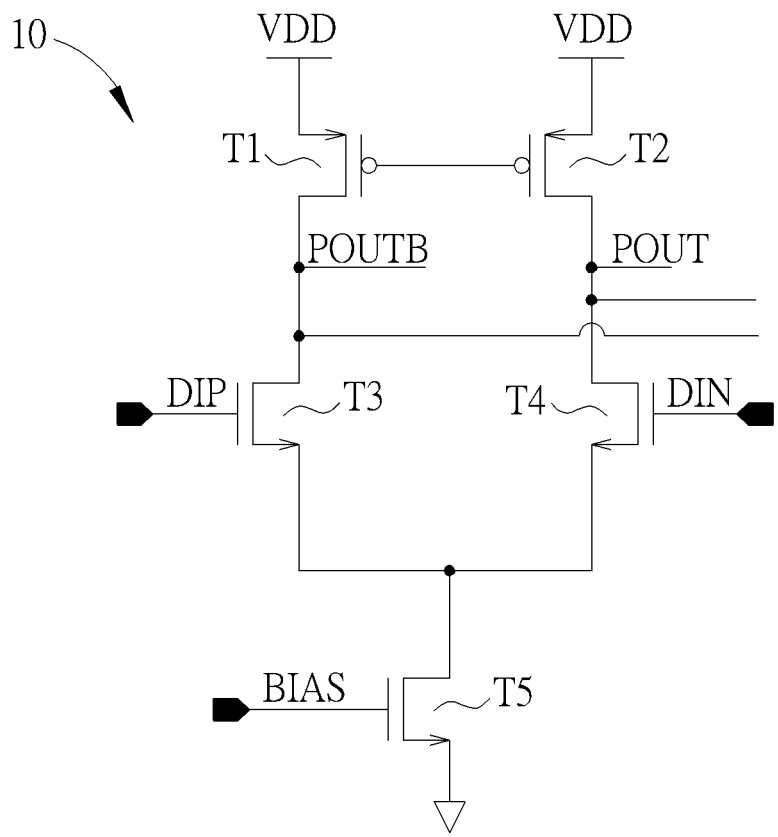
FIG. 2 is a structure of a first amplifier of the self-controlled input data buffer circuit in FIG. 1.
Figure 3:
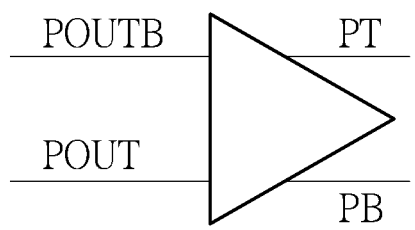
FIG. 3 is a structure of a second amplifier of the self-controlled input data buffer circuit in FIG. 1.

FIG. 2 is a structure of the first amplifier 10 of the self-controlled input data buffer circuit 100. FIG. 3 is a structure of the second amplifier 11 of the self-controlled input data buffer circuit 100. The first amplifier 10 and the second amplifier 11 can be any type of amplifier. For example, the first amplifier 10 and the second amplifier 11 can be voltage amplifiers, current amplifiers, or differential amplifiers. In FIG. 2, the first amplifier 10 can be a differential amplifier. The first amplifier 10 can include a first transistor T1, a second transistor T2, a third transistor T3, a fourth transistor T4, and a fifth transistor T5. The first transistor T1 includes a first terminal for receiving a working voltage VDD, a second terminal, and a control terminal. The second transistor T2 includes a first terminal for receiving the working voltage VDD, a second terminal, and a control terminal coupled to the control terminal of the first transistor T1. The third transistor T3 includes a first terminal coupled to the second terminal of the first transistor T1, a second terminal, and a control terminal for receiving the data signal DIP. The fourth transistor T4 includes a first terminal coupled to the second terminal of the second transistor T2, a second terminal coupled to the second terminal of the third transistor T3, and a control terminal for receiving the reference signal DIN. The fifth transistor T5 includes a first terminal coupled to the second terminal of the fourth transistor T4, a second terminal coupled to a ground terminal, and a control terminal for receiving a biased voltage signal BIAS. Here, the first transistor T1 and the second transistor T2 can be P-type Metal-Oxide-Semiconductor Field Effect Transistors (PMOSFET). The third transistor T3, the fourth transistor T4, and the fifth transistor T5 can be N-type Metal-Oxide-Semiconductor Field Effect Transistors (NMOSFET). The biased voltage signal BIAS can be a customized or predetermined voltage signal for controlling a conduction state of the fifth transistor T5. Therefore, a current of the fifth transistor T5 can be controlled by the biased voltage signal BIAS. Further, when the third transistor T3 and the fourth transistor T4 are operated in a linear region and the first transistor T1 and the second transistor T2 are enabled, two outputs of the first amplifier 10 (i.e., the first output signal POUTB and the second output signal POUT) can be linearly amplified according to the data signal DIP and the reference signal DIN. Particularly, the first output signal POUTB is at the first terminal of the third transistor T3. The second output signal POUT is at the first terminal of the fourth transistor T4. Further, the first output signal POUTB and the second output signal POUT are complementary. In FIG. 3, the second amplifier 11 can be a differential amplifier. The first output signal POUTB and the second output signal POUT of the first amplifier 10 are inputted to the second amplifier 11. The second amplifier 11 includes a first input terminal coupled to the first output terminal of the first amplifier 10, a second input terminal coupled to the second output terminal of the first amplifier 10, a first output terminal coupled to the feedback signal generator 12, and a second output terminal. Therefore, the first output signal POUTB and the second output signal POUT can be amplified to generate the third output signal PT and the fourth output signal PB by the second amplifier 11. The third output signal PT is outputted from the first output terminal of the second amplifier 11. The fourth output signal PB is outputted from the second output terminal of the second amplifier 11. Further, the third output signal PT and the fourth output signal PB are complementary.

Figure 4:
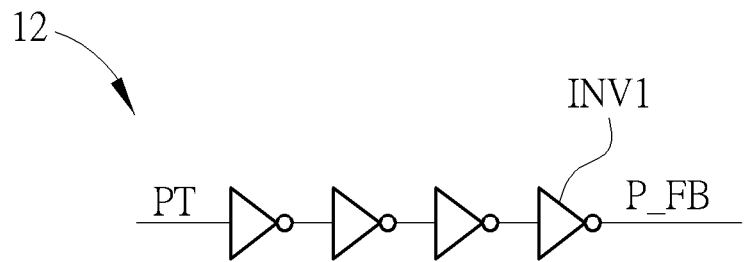
FIG. 4 is a structure of a feedback signal generator of the self-controlled input data buffer circuit in FIG. 1.

FIG. 4 is a structure of a feedback signal generator 12 of the self-controlled input data buffer circuit 100. The feedback signal generator 12 includes a plurality of first inverters INV1 coupled in series. The plurality of first inverters INV1 are used for delaying the third output signal PT of the first output terminal of the second amplifier 11 for outputting the feedback signal P_FB. As shown in FIG. 4, the number of inverters in the feedback signal generator 12 is not limited. Further, since each inverter has its time delay, the more inverters used to the feedback signal generator 12, the greater time delay is introduced.

Figure 5:
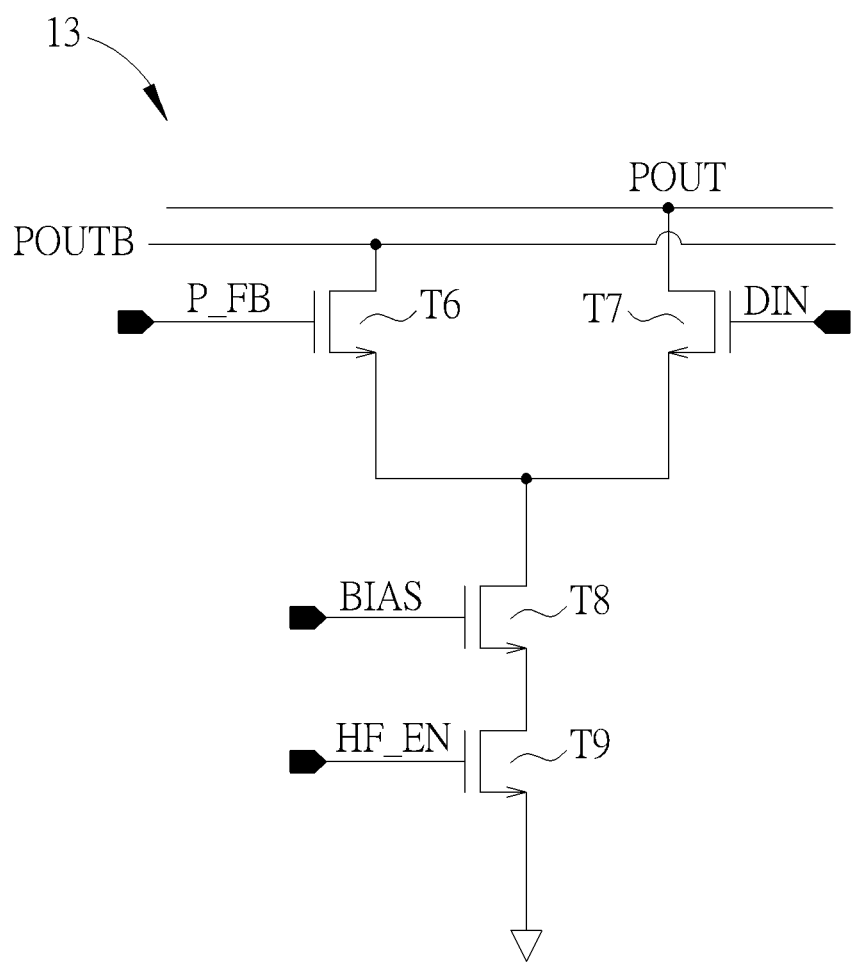
FIG. 5 is a structure of a gain control unit of the self-controlled input data buffer circuit in FIG. 1.

FIG. 5 is a structure of the gain control unit 13 of the self-controlled input data buffer circuit 100. The gain control unit 13 includes a sixth transistor T6, a seventh transistor T7, an eighth transistor T8, and a ninth transistor T9. The sixth transistor T6 includes a first terminal coupled to the first output terminal of the first amplifier 10 (i.e., for receiving the first output signal POUTB), a second terminal, and a control terminal coupled to the feedback signal generator 12 for receiving the feedback signal P_FB. The seventh transistor T7 includes a first terminal coupled to the second output terminal of the first amplifier 10 (i.e., for receiving the second output signal POUT), a second terminal coupled to the second terminal of the sixth transistor T6, and a control terminal for receiving the reference signal DIN. The eighth transistor T8 includes a first terminal coupled to the second terminal of the seventh transistor T7, a second terminal, and a control terminal for receiving the biased voltage signal BIAS. Here, the biased voltage signal BIAS can be the customized or predetermined voltage signal for controlling a conduction state of the eighth transistor T8. The ninth transistor T9 includes a first terminal coupled to the eighth transistor T8, a second terminal coupled to a ground terminal, and a control terminal for receiving an enabling signal HF_EN. In the gain control unit 13, when the eighth transistor T8 is an NMOSFET, a voltage of the biased voltage signal BIAS can control the conduction state of the eighth transistor T8. Therefore, a current of the eighth transistor T8 can be controlled by the biased voltage signal BIAS. In the gain control unit 13, the sixth transistor T6, the seventh transistor T7, the eighth transistor T8, and the ninth transistor T9 are NMOSFETs. The enabling signal HF_EN can be regarded as an On-Off key signal. For example, if the enabling signal HF_EN is a low voltage signal, the ninth transistor T9 is disabled. Therefore, the current of the ninth transistor T9 is absent. As a result, the gain control unit 13 is turned off (i.e., disabled to adjust the voltage gain or power gain). If the enabling signal HF_EN is a high voltage signal, the ninth transistor T9 is turned on. As a result, the gain control unit 13 can adjust the voltage gain or power gain according to the biased voltage signal BIAS, the reference signal DIN, and the feedback signal P_FB. Further, since the reference signal DIN is received by the control terminal of the seventh transistor T7, a cross voltage between the reference signal DIN and the second output signal POUT can control the conduction state of the seventh transistor T7. Similarly, since the feedback signal P_FB is received by the control terminal of the sixth transistor T6, a cross-voltage between the feedback signal P_FB and the first output signal POUTB can control the conduction state of the sixth transistor T6. For example, when the sixth transistor T6 and the seventh transistor T7 are enabled, since the voltages of the first output signal POUTB and the second output signal POUT are complementary, a current between the sixth transistor T6 and the seventh transistor T7 can be generated. Further, since the biased voltage signal BIAS controls the conduction state of the eighth transistor T8, a part of current between the sixth transistor T6 and the seventh transistor T7 can be transmitted to the ground terminal through the eighth transistor T8 and the ninth transistor T9. As a result, when the intensity of the current between the sixth transistor T6 and the seventh transistor T7 is changed, the gain control unit 13 can adjust a power gain by processing the first output signal POUTB and the second output signal POUT.

To sum up, the present invention illustrates a self-controlled input data buffer circuit. The self-controlled input data buffer circuit introduces a gain control unit. The self-controlled input data buffer circuit can automatically adjust the power gain according to the input data signal for optimizing the power consumption. Therefore, the self-controlled input data buffer circuit can be applied to a high speed DRAM system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A self-controlled input data buffer circuit comprising:
a first amplifier comprising:
a first input terminal configured to receive a data signal;
a second input terminal configured to receive a reference signal;
a first output terminal; and
a second output terminal;
a second amplifier coupled to the first output terminal of the first amplifier and the second output terminal of the first amplifier;
a feedback signal generator coupled to the second amplifier; and
a gain control unit coupled to the feedback signal generator, the second input terminal of the first amplifier, the first output terminal of the first amplifier, and the second output terminal of the first amplifier.

2. The circuit of claim 1, wherein the first amplifier further comprises:
a first transistor comprising:
a first terminal configured to receive a working voltage;
a second terminal; and
a control terminal;
a second transistor comprising:
a first terminal configured to receive the working voltage;
a second terminal; and
a control terminal coupled to the control terminal of the first transistor;
a third transistor comprising:
a first terminal coupled to the second terminal of the first transistor;
a second terminal; and
a control terminal configured to receive the data signal;
a fourth transistor comprising:
a first terminal coupled to the second terminal of the second transistor;
a second terminal coupled to the second terminal of the third transistor; and
a control terminal configured to receive the reference signal; and
a fifth transistor comprising:
a first terminal coupled to the second terminal of the fourth transistor;
a second terminal coupled to a ground terminal; and
a control terminal configured to receive a biased voltage signal.

3. The circuit of claim 2, wherein the first transistor and the second transistor are P type Metal-Oxide-Semiconductor Field Effect Transistors, the third transistor, the fourth transistor, and the fifth transistor are N type Metal-Oxide-Semiconductor Field Effect Transistors.

4. The circuit of claim 1, wherein the feedback signal generator comprises:
a plurality of first inverters coupled in series and configured to delay a signal of the first output terminal of the second amplifier for outputting a feedback signal.

5. The circuit of claim 1, wherein the gain control unit comprises:
a sixth transistor comprising:
a first terminal coupled to the first output terminal of the first amplifier;
a second terminal; and
a control terminal coupled to the feedback signal generator and configured to receive a feedback signal;
a seventh transistor comprising:
a first terminal coupled to the second output terminal of the first amplifier;
a second terminal coupled to the second terminal of the sixth transistor; and
a control terminal configured to receive the reference signal;
an eighth transistor comprising:
a first terminal coupled to the second terminal of the seventh transistor;
a second terminal; and
a control terminal configured to receive a biased voltage signal; and
a ninth transistor comprising:
a first terminal coupled to the second terminal of the eighth transistor;
a second terminal coupled to a ground terminal; and
a control terminal configured to receive an enabling signal.

6. The circuit of claim 5, wherein the sixth transistor, the seventh transistor, the eighth transistor, and the ninth transistor are N type Metal-Oxide-Semiconductor Field Effect Transistors.

7. The circuit of claim 5, wherein when the ninth transistor is enabled according to the enabling signal, a voltage gain of the gain control unit is adjusted according to the biased voltage signal, the reference signal, and the feedback signal.

8. The circuit of claim 5, wherein when the ninth transistor is disabled according to the enabling signal, the gain control unit is turned off.

9. The circuit of claim 1, wherein the first amplifier and the second amplifier are differential amplifiers.

10. The circuit of claim 1, wherein a signal outputted from the first output terminal of the first amplifier and a signal outputted from the second output terminal of the first amplifier are complementary.

* * * * *